(12) United States Patent
Grover et al.

(10) Patent No.: US 7,717,715 B2
(45) Date of Patent: May 18, 2010

(54) SYSTEM, METHOD AND APPARATUS USING AT LEAST ONE FLEX CIRCUIT TO CONNECT A PRINTED CIRCUIT BOARD AND A SOCKET CARD ASSEMBLY THAT ARE ORIENTED AT A RIGHT ANGLE TO ONE ANOTHER

(75) Inventors: Sanjeev Grover, San Jose, CA (US); Benson Morris, Santa Cruz, CA (US); Todd Sholl, San Jose, CA (US); Stephen Bellato, Martinez, CA (US); Kenneth D. Karklin, Pasadena, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/688,757

(22) Filed: Mar. 20, 2007

(65) Prior Publication Data
US 2008/0233769 A1 Sep. 25, 2008

(51) Int. Cl.
*H01R 12/00* (2006.01)
(52) U.S. Cl. ..................................................... 439/62
(58) Field of Classification Search .................. 439/61, 439/62, 65, 66, 67, 632, 493
See application file for complete search history.

(56) References Cited

U.S. PATENT DOCUMENTS

| | | | | |
|---|---|---|---|---|
| 3,401,369 A | * | 9/1968 | Roche et al. .................. 439/62 |
| 5,161,986 A | * | 11/1992 | Gulbranson et al. ........... 439/92 |
| 5,165,055 A | * | 11/1992 | Metsler ....................... 333/12 |
| 5,199,881 A | * | 4/1993 | Oshita et al. .................. 439/65 |
| 5,564,931 A | * | 10/1996 | Fabian et al. .................. 439/62 |
| 5,742,168 A | | 4/1998 | Kiyokawa et al. |
| 6,077,124 A | * | 6/2000 | Etters et al. .................. 439/632 |
| 6,257,933 B1 | | 7/2001 | Awaji |
| 6,997,720 B2 | * | 2/2006 | Perret et al. ................... 439/67 |

* cited by examiner

*Primary Examiner*—Chandrika Prasad
(74) *Attorney, Agent, or Firm*—Holland & Hart, LLP

(57) ABSTRACT

There is disclosed apparatus for routing signals between at least one PCB within a test head and a socket card assembly. In an embodiment, the apparatus may include at least one flexible circuit electrically connecting first and second sides of the PCB and the socket card assembly with one another, and the flexible circuit having a defined shape configured to interface with the socket card assembly and the PCB along substantially perpendicular planes. Methods of routing signals between at least one PCB within a test head and a socket card assembly are disclosed. In one embodiment, a method may include electrically connecting first and second sides of the PCB and the socket card assembly with one another with at least one flexible circuit having a defined shape configured to interface with the socket card assembly and the PCB along substantially perpendicular planes. Other embodiments are also disclosed.

22 Claims, 11 Drawing Sheets

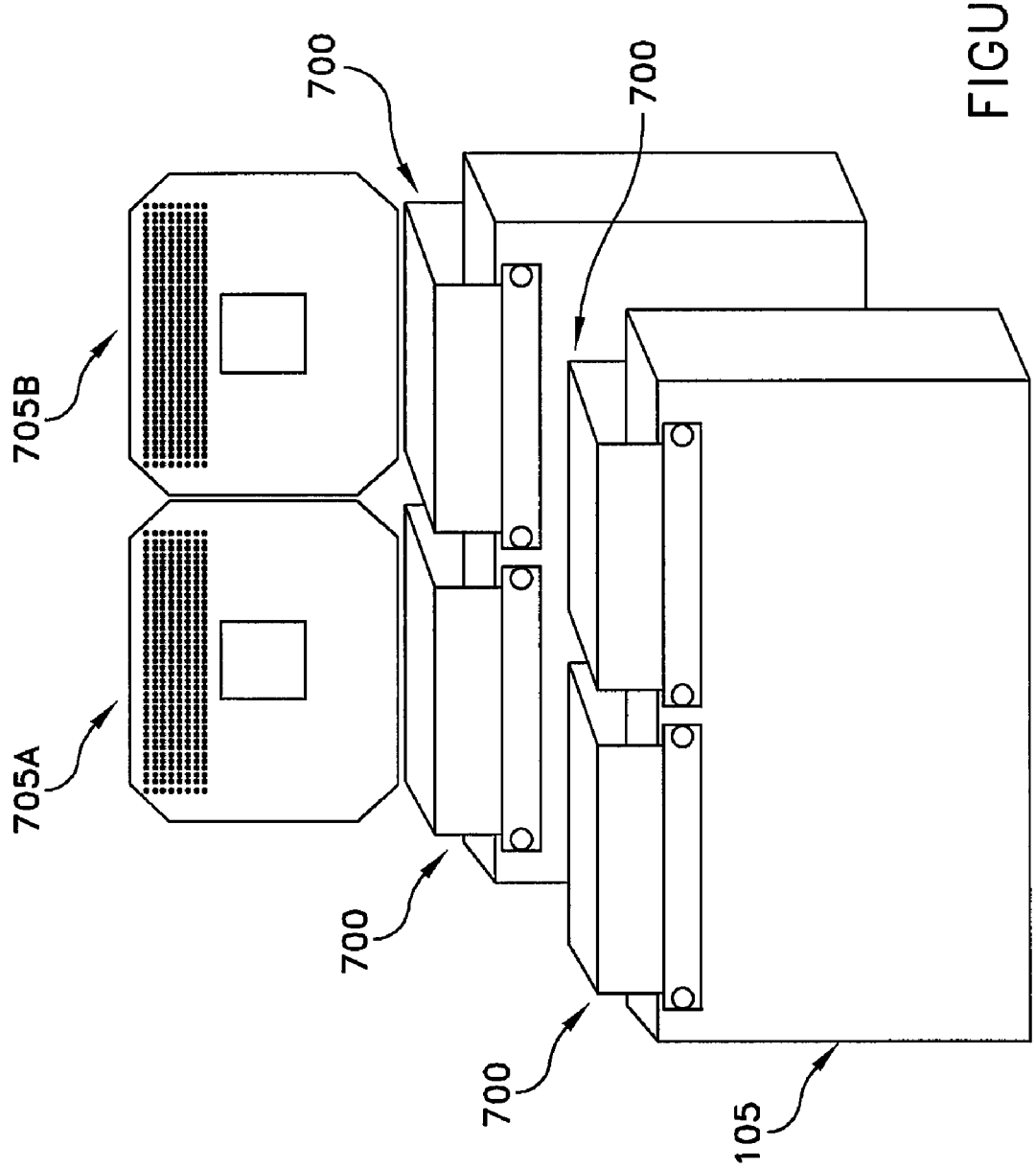

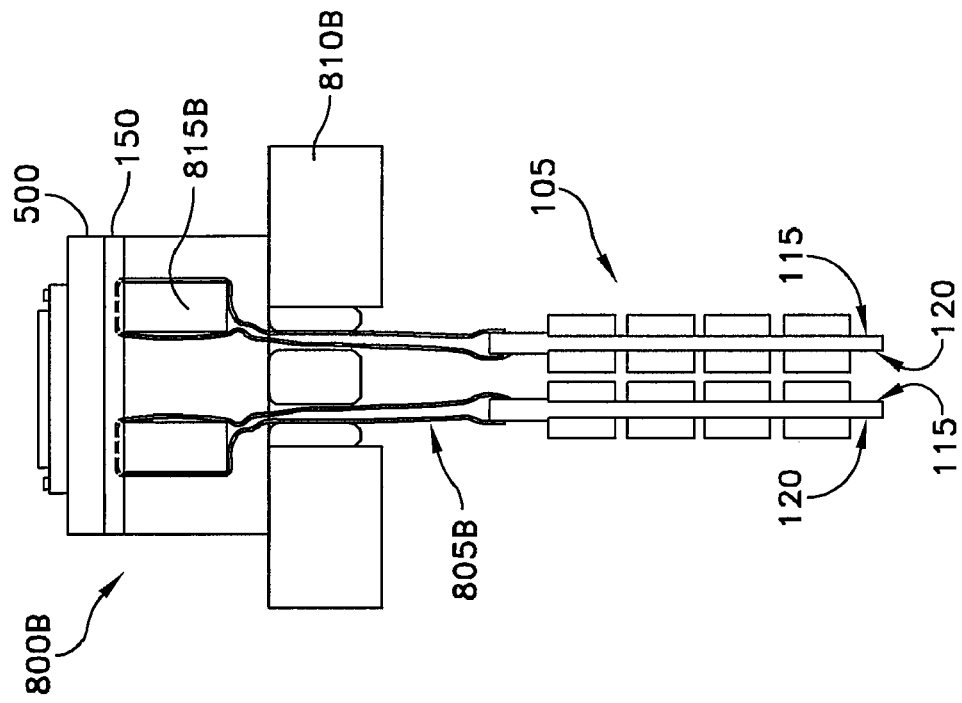
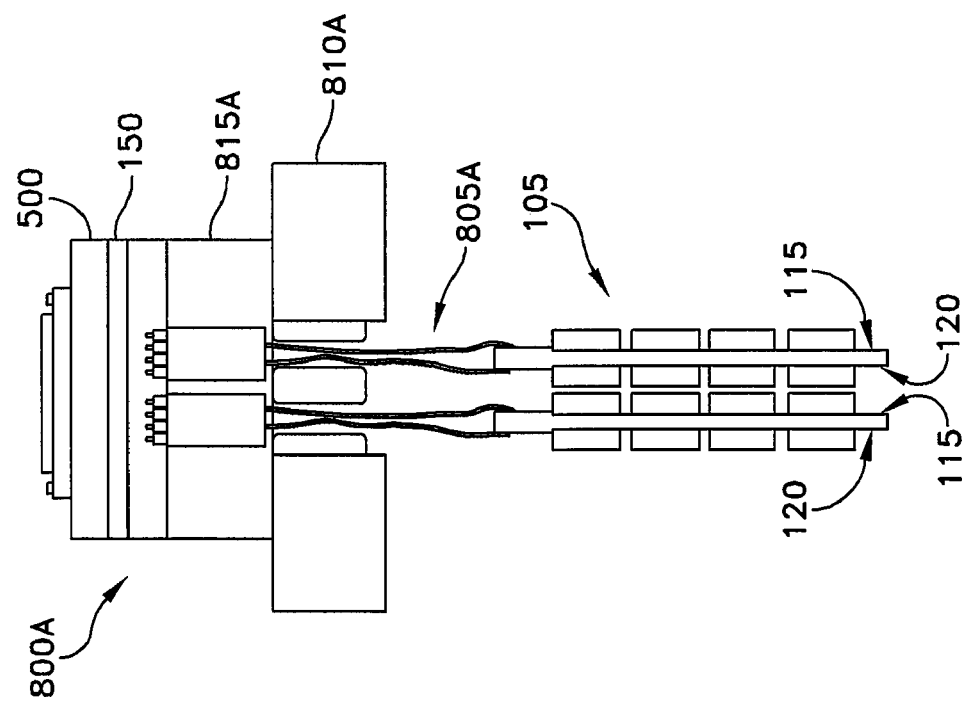
FIGURE 8B
FIGURE 8A
(PRIOR ART)

SYSTEM, METHOD AND APPARATUS USING AT LEAST ONE FLEX CIRCUIT TO CONNECT A PRINTED CIRCUIT BOARD AND A SOCKET CARD ASSEMBLY THAT ARE ORIENTED AT A RIGHT ANGLE TO ONE ANOTHER

BACKGROUND

Generally, interconnect technologies used in interfaces for ATE systems are limited by one or more of density, performance, and flexibility. Testing of large devices in parallel requires cost effective, high density, high performance right angle interconnect.

Any interface generally includes the electromechanical assembly between the device or devices under test (i.e., DUT (S)) and the test system electronics (or automated test equipment, i.e., ATE). The interface generally includes device specific and non-device specific portions. The device specific portion exists adjacent to, and connects with, the DUT(s). The non-device specific portion connects with test system electronics, which may include one or more printed circuit boards. Various ways are employed to connect different parts in an interface. Right angle connection can be one of the most challenging interconnects.

For example, FIG. 9 illustrates a prior art connection system 900. FIG. 10 illustrates another prior art connection system 1000. FIG. 11 illustrates components of yet another prior art connection 1100.

In memory ATE, particularly relating to solutions from Advantest, the "interface" may also be known as a HiFix™ brand device specific interface, which may proceed before the words "high performance fixture." The HiFix brand interface has historically included a set of PCBs forming the connection plane between the HiFix interconnect and the ATE, a collection of transmission line assemblies which connect to the "socket card" of a socket card assembly (also referred to as an SCA). If developed and delivered as a complete assembly, this entire extended HiFiX™ assembly is considered to be device specific and the attachment method between the SCAs and the transmission lines is generally achieved through the direct soldering of pre-terminated coaxial cables to the tester-side of the SCA. This makes the entire HiFix™ assembly expensive and minimally re-usable. But, historically, in a world of memory DUTs conforming to JEDEC (or similar) packaging standards and rarely changing, this does not necessarily present a cost challenge to the Memory ATE end user, who must bear the expense of each device changeover and all device specific test hardware. Alternatively, the SCAs in the Hi-Fix™ brand device specific interface may be attached by a pin-socket or coaxial connection system. See, for example, U.S. Pat. No. 6,257,933, issued Jul. 10, 2001, to Toshiaki Awaji, and assigned to Advantest Corporation of Tokyo, Japan, and U.S. Pat. No. 5,742,168, issued Apr. 21, 1998, to Toshiaki Awaji, et al., and assigned to Advantest Corporation of Tokyo, Japan. However, these types of prior art systems are significantly limited in density (i.e., connections per unit surface area).

As memory devices are now packaged in an increasing diversity of package types and formats over time, which is largely driven by the need for miniaturization in the mobile electronic and handset market, there have been many developments to reduce the expense of DUT specific test hardware. Advantest and TSE, for example, have developed HiFiX™ (or "u-TIS"™ in the case of TSE) interfaces that are generic and feature a non-permanent connection plane like VHDM connectors between the SCA (or collection of SCAs) and the remainder of the interface. Thus, the SCA becomes the only device specific layer requiring regular changeover between DUTs.

SUMMARY OF THE INVENTION

In an embodiment, there is provided apparatus for routing signals between at least one printed circuit board (PCB) within a test head and a socket card assembly for electrically connecting the at least one PCB with a plurality of devices under test, the apparatus comprising at least one flexible circuit electrically connecting first and second sides of the PCB and the socket card assembly with one another, and the at least one flexible circuit having a defined shape configured to interface with the socket card assembly along one plane and the sides of the PCB along other planes substantially perpendicular to the one plane.

In another embodiment, there is provided an ATE system for testing a plurality of devices, the ATE system comprising a test head having at least one printed circuit board (PCB) for processing test signals; at least one flexible circuit for electrically connecting first and second sides of the PCB and a socket card assembly with one another, the at least one flexible circuit having a defined shape configured to interface with the socket card assembly along one plane and the sides of the PCB along other planes substantially perpendicular to the one plane; and an interface configured for electrically connecting the socket card assembly with the devices under test carried by a handler.

In yet another embodiment, there is provided a method of routing signals between at least one printed circuit board (PCB) within a test head and a socket card assembly for electrically connecting the at least one PCB with a plurality of devices under test, the method comprising electrically connecting first and second sides of the PCB and the socket card assembly with one another with at least one flexible circuit having a defined shape configured to interface with the socket card assembly along one plane and the sides of the PCB along other planes substantially perpendicular to the one plane.

Other embodiments are also disclosed.

BRIEF DESCRIPTION OF THE DRAWINGS

Illustrative embodiments of the invention are illustrated in the drawings, in which:

FIG. 7 is a schematic illustration of an exemplary embodiment of a right angle interconnect;

FIG. 8A illustrates a prior art version of a connection system between a pair of printed circuit boards of test system electronics and a socket card assembly;

FIG. 8B illustrates an exemplary embodiment of a right angle connection systems between a pair of printed circuit boards of test system electronics and a socket card assembly.

DETAILED DESCRIPTION

Figure 1:
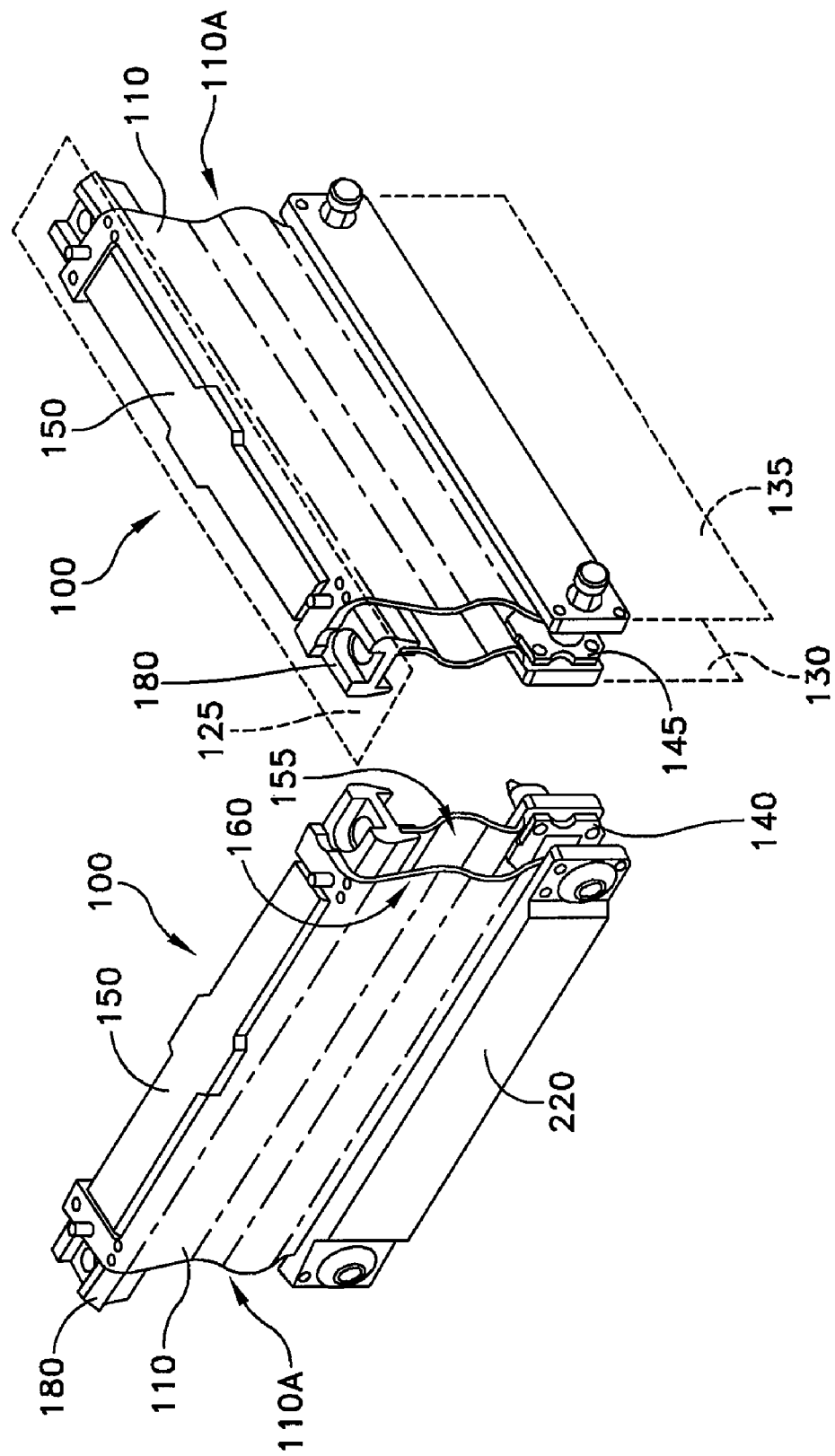
FIG. 1 illustrates an exemplary embodiment of a pair of right angle connection flexible circuits.

Referring to FIGS. 1-3, 4A and 5, and in an exemplary embodiment, there may be provided apparatus 100 (also referred to as assembly 100 herein) for routing signals between at least one printed circuit board 105 (FIGS. 3 and 4A) and a socket card assembly 500. Printed circuit board 105 (also referred to as PCB 105 and "demux" board 105 herein) may be disposed within a test head 505. Socket card assembly 500 may be configured for electrically connecting the at least one PCB 105 with a plurality of devices under test 510. Apparatus 100 may include at least one flexible circuit 110 electrically connecting first and second sides of PCB 115, 120 and socket card assembly 500 with one another. The at least one flexible circuit 110 may have a defined shape configured to interface with socket card assembly 500 along one plane 125 and the sides of the PCB 115, 120 along other planes 130, 135 substantially perpendicular to the one plane 125.

In one embodiment, the at least one flexible circuit 110 may include a single flexible circuit 110A configured for electrically connecting socket card assembly 500 with both of the first and second sides of PCB 115, 120. Additionally, a pair of interposer assemblies 140, 145 may optionally be provided for removable connection of single flexible circuit 110A to the first and second sides of PCB 115, 120, respectively. An interposer assembly 150 may also be provided for removable connection of single flexible circuit 110A and socket card assembly 500 to one another.

In an embodiment, single flexible circuit 110A may have an inner surface 155 and an outer surface 160. Outer surface 160 may have a terminal area of circuitry 165 for removable connection with socket card assembly 500. Inner surface 155 may have a pair of terminal areas of circuitry 170, 175 for connection with the first and second sides 115,120 of PCB 105, respectively. Optionally, single flexible circuit 110A may also include a support 180 in connection with inner surface 155, opposite of the terminal areas of circuitry 170, 175 for connection with the first and second sides of PCB 115, 120.

In another embodiment, flexible circuit 110B may have a terminal area of circuitry 165B for removable connection with the socket card assembly 500 on one side 160. Flexible circuit 110 may have terminal area of circuitry 170 for removable connection with one of the first and second sides 115, 120 of PCB 105 on another side 155 (opposite to the one side 160 with the terminal area of circuitry 165 for removable connection with socket card assembly 500).

In an embodiment, a pair of flexible circuits 110B may be configured for electrically connecting socket card assembly 500 with each of the first and second sides 115, 120 of PCB 105, respectively. In one embodiment, a pair of interposer assemblies 140B, 145B may be provided for removable connection of the pair of flexible circuits 110B to the first and second sides 115, 120 of PCB 105, respectively. In addition, another pair of interposer assemblies 150B may be provided for removable connection of the pair of flexible circuits 110B to socket card assembly 500, respectively.

Figure 4:
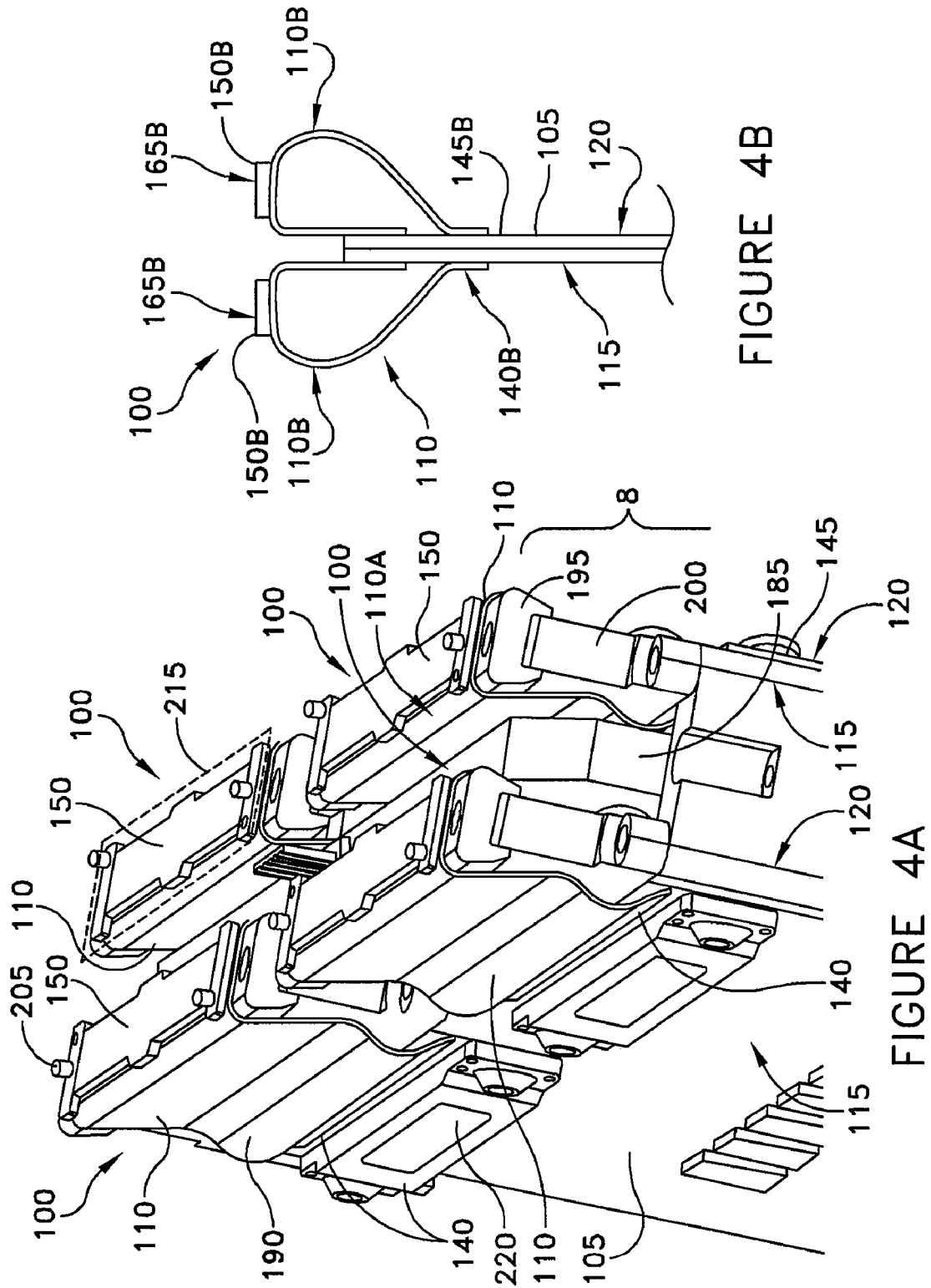
FIGS. 4A and 4B illustrate exemplary embodiments of right angle connection systems attached to printed circuit boards of test system.
Figure 5:
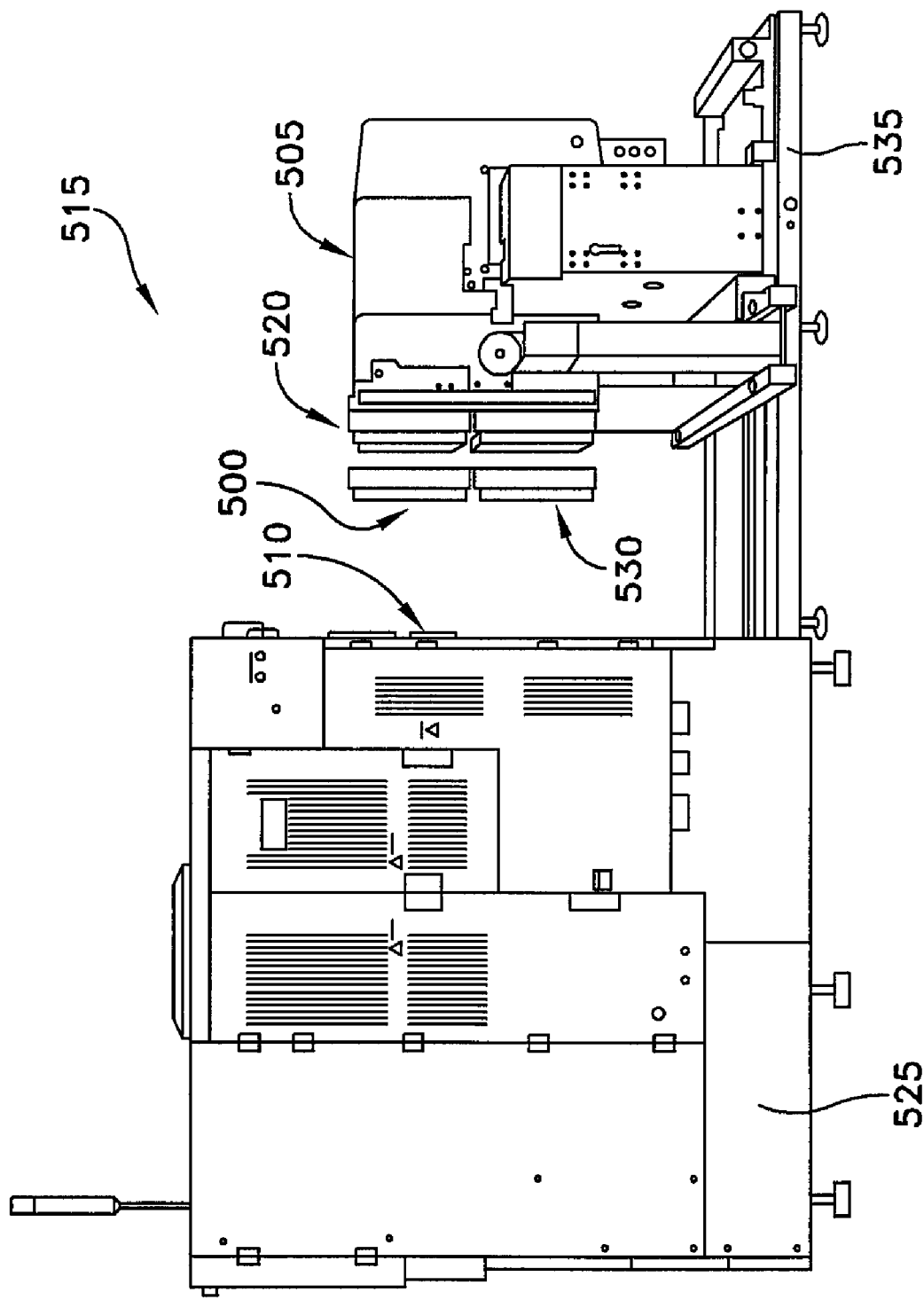
FIG. 5 illustrates an exemplary test cell for testing memory chips in final package with a test-head, manipulator, interface and handler.

Looking at FIGS. 4A, 4B and 5, and in an exemplary embodiment, there may be provided an ATE system 515 (FIG. 5) for testing a plurality of devices. ATE system 515 may include test head 505 having at least one printed circuit board 105 (FIGS. 4A and 4B) for processing test signals. ATE system 515 may include at least one flexible circuit 110 (FIGS. 4A and 4B) for electrically connecting first and second sides 115, 120 of PCB 105 and a socket card assembly 500 with one another. Generally, the at least one flexible circuit may have a defined shape configured to interface with socket card assembly 500 along one plane 125 (FIG. 1) and the sides of PCB 105 along other planes 130, 135 (FIG. 1), which may be substantially perpendicular to the one plane 125. ATE 515 may include an interface 520 configured for electrically connecting socket card assembly 500 with devices under test 510 carried by a handler 525.

High density, right-angle interconnect assemblies 100 (FIG. 1) with ATE interface 520 may allow testing many semiconductor devices in a highly parallel manner. Flexible circuit 110 may be integrated as a short interconnect placed between a custom ASIC (not shown) and a device specific interface 530 (DSI) so as to allow test signals (both inputs and outputs) to be routed to an array of locations and then routed to various devices in parallel.

Figure 6:
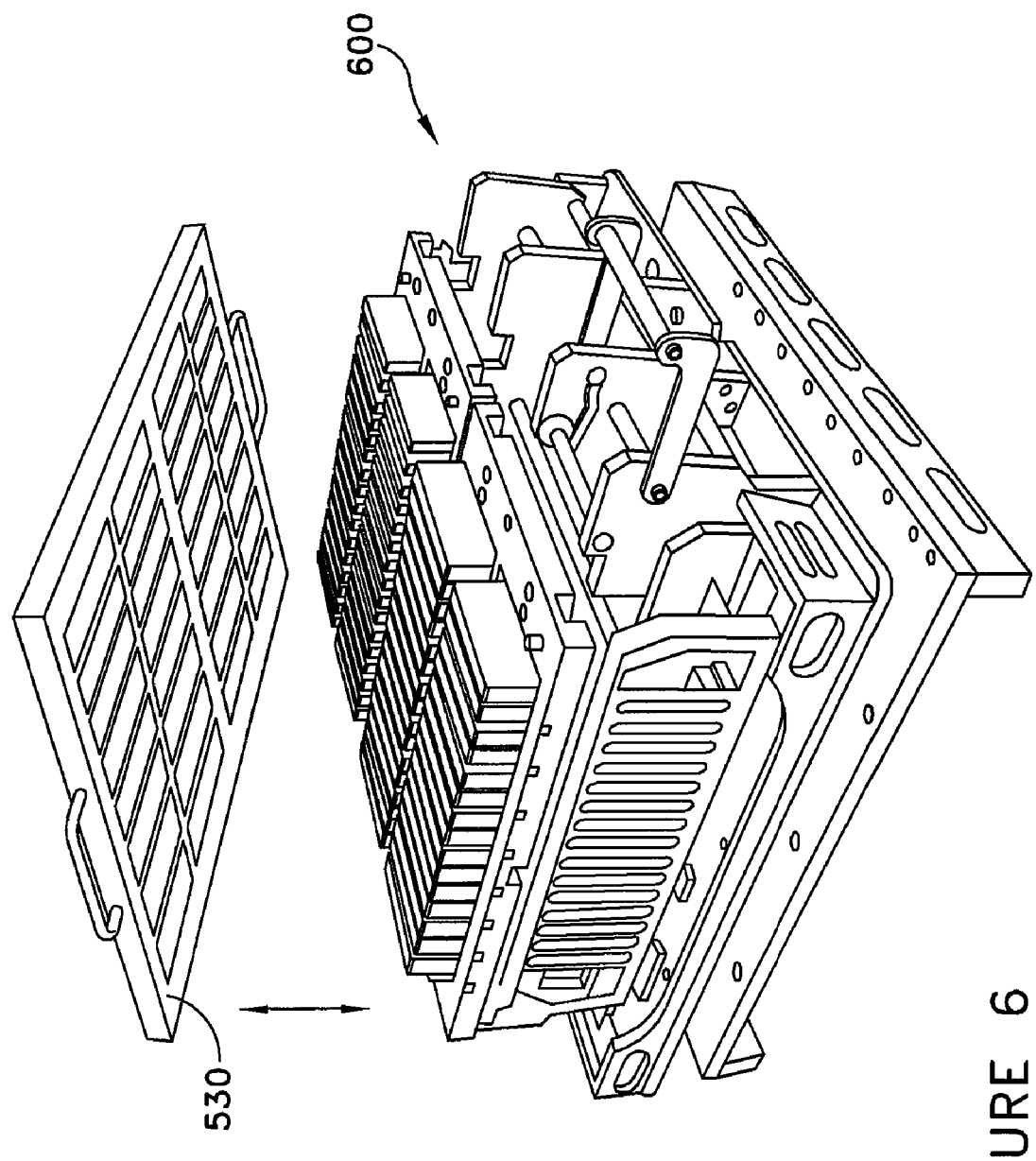
FIG. 6 illustrates a programmable interface matrix assembled with a novel array of printed circuit boards of test system electronics and a plurality of novel right angle connection flexible circuits.
Figure 9:
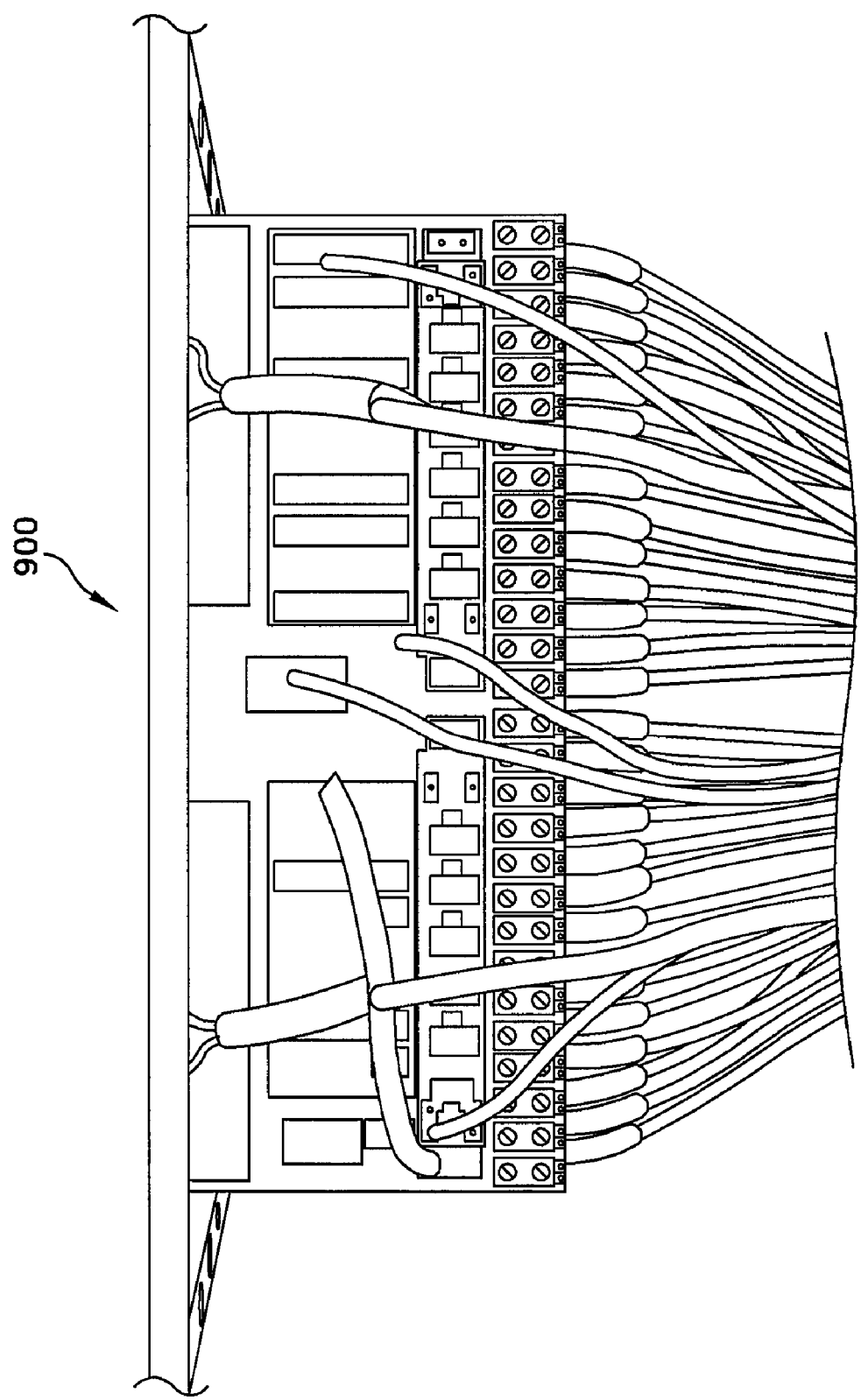
FIGS. 9-11 illustrate prior art right angle connectors for connecting test electronics of printed circuit boards to socket card assemblies.
Figure 10:
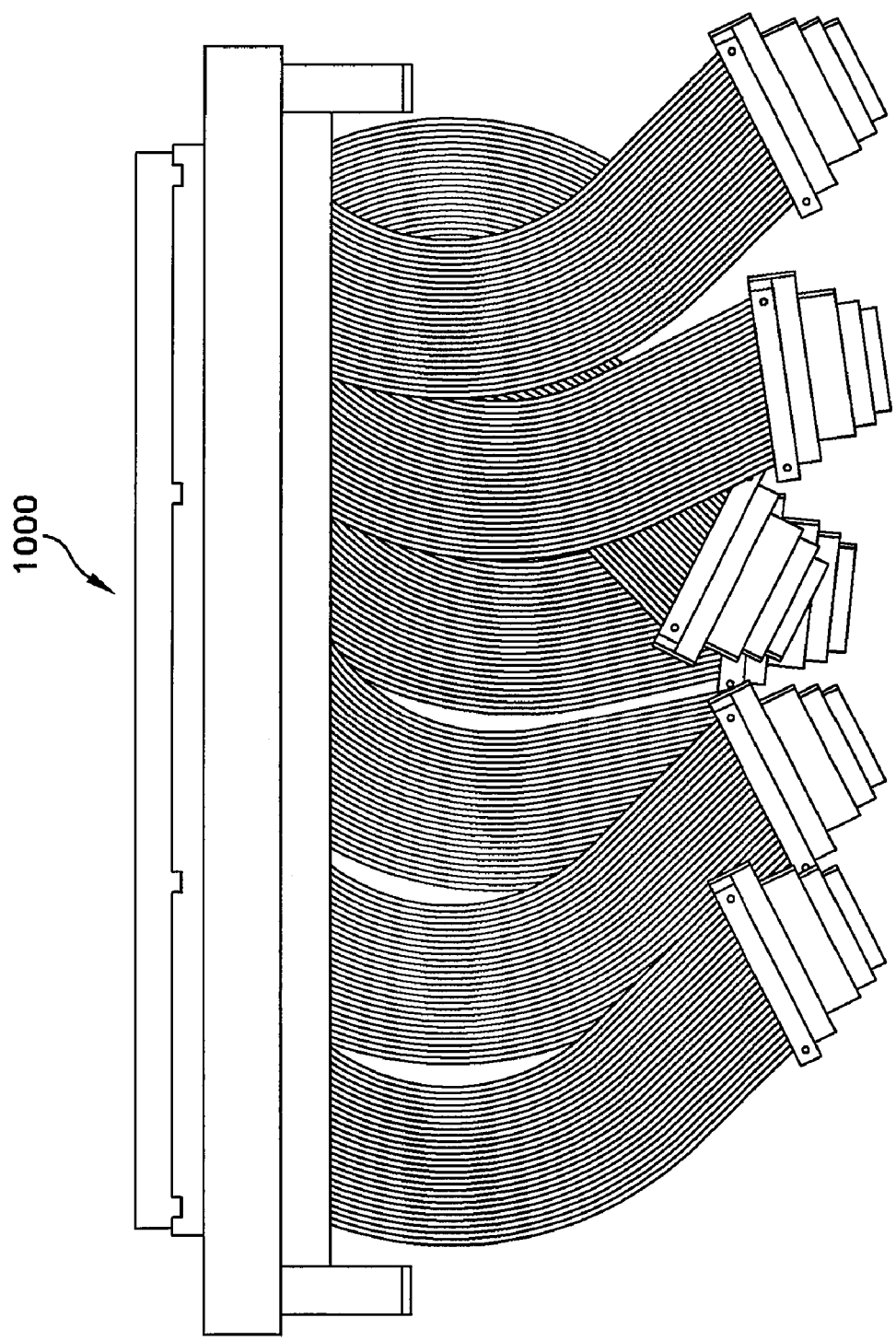
Figure 11:
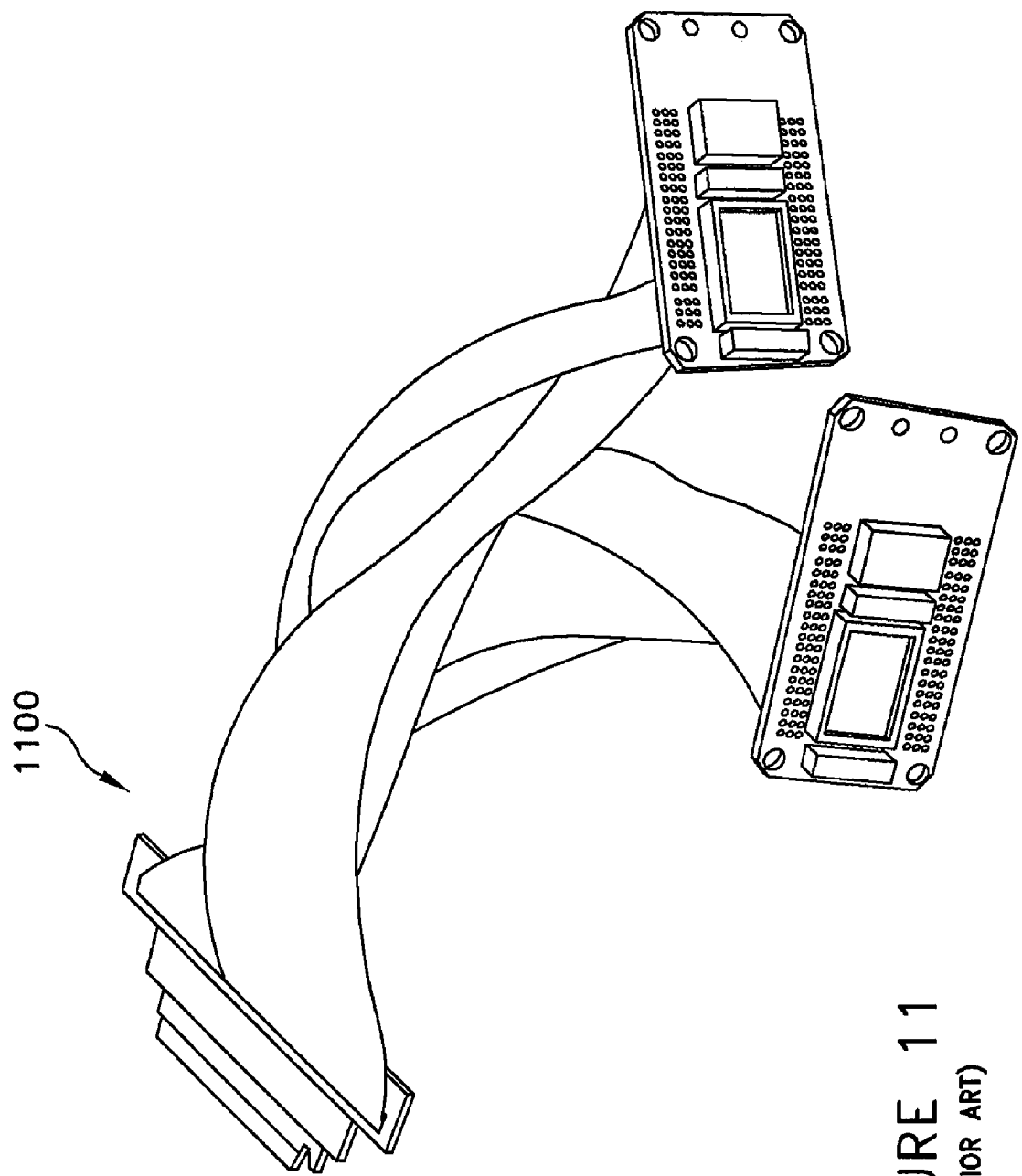

As best illustrated in FIG. 6, a programmable interface matrix 600 may be provided with an array of printed circuit boards of test system electronics. Controlled impedance flexible circuits of matrix 600 may form a right angle connection system of extreme density flexible circuits, which may be combined with compliant mechanism and interposer/interconnect technologies. Such high density and complaint interconnects allow high signal fidelity (i.e., integrity), with minimum line length to DUT, while offering unprecedented density and parallelism.

In an embodiment, flexible circuit 110 (FIG. 3) may provide an economical, reliable and high performance ATE signal delivery system that offers significant efficiency advantages when testing intergrated circuit (IC) devices in a highly parallel manner. Flexible circuits 110, when used in arrays, may permit the full pin count testing of over 500 memory devices in parallel and is limited principally by available IC handler systems.

Figure 2:
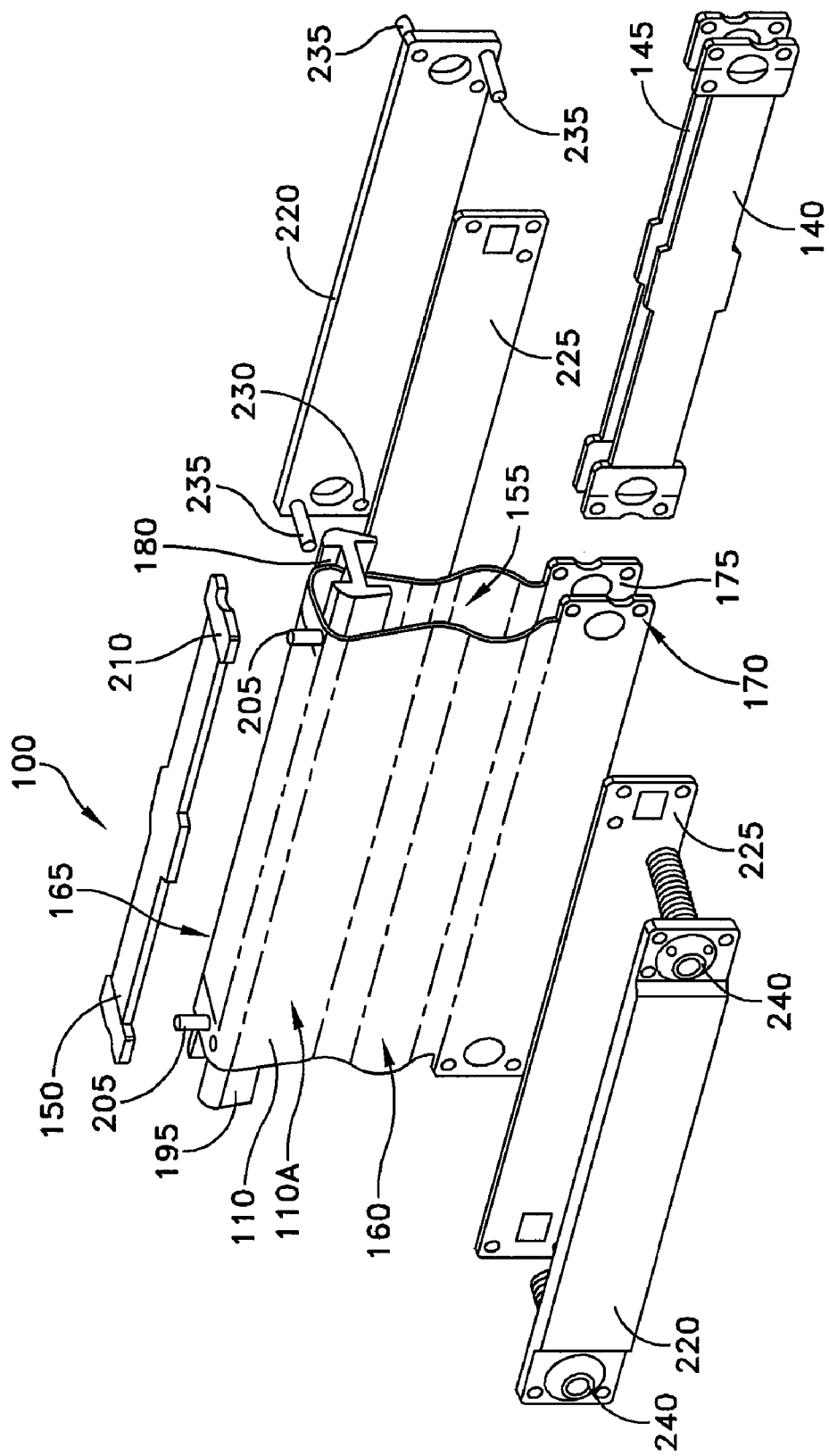
FIG. 2 illustrates an exploded view of one of the right angle connection flexible circuits shown in FIG. 1.
Figure 3:
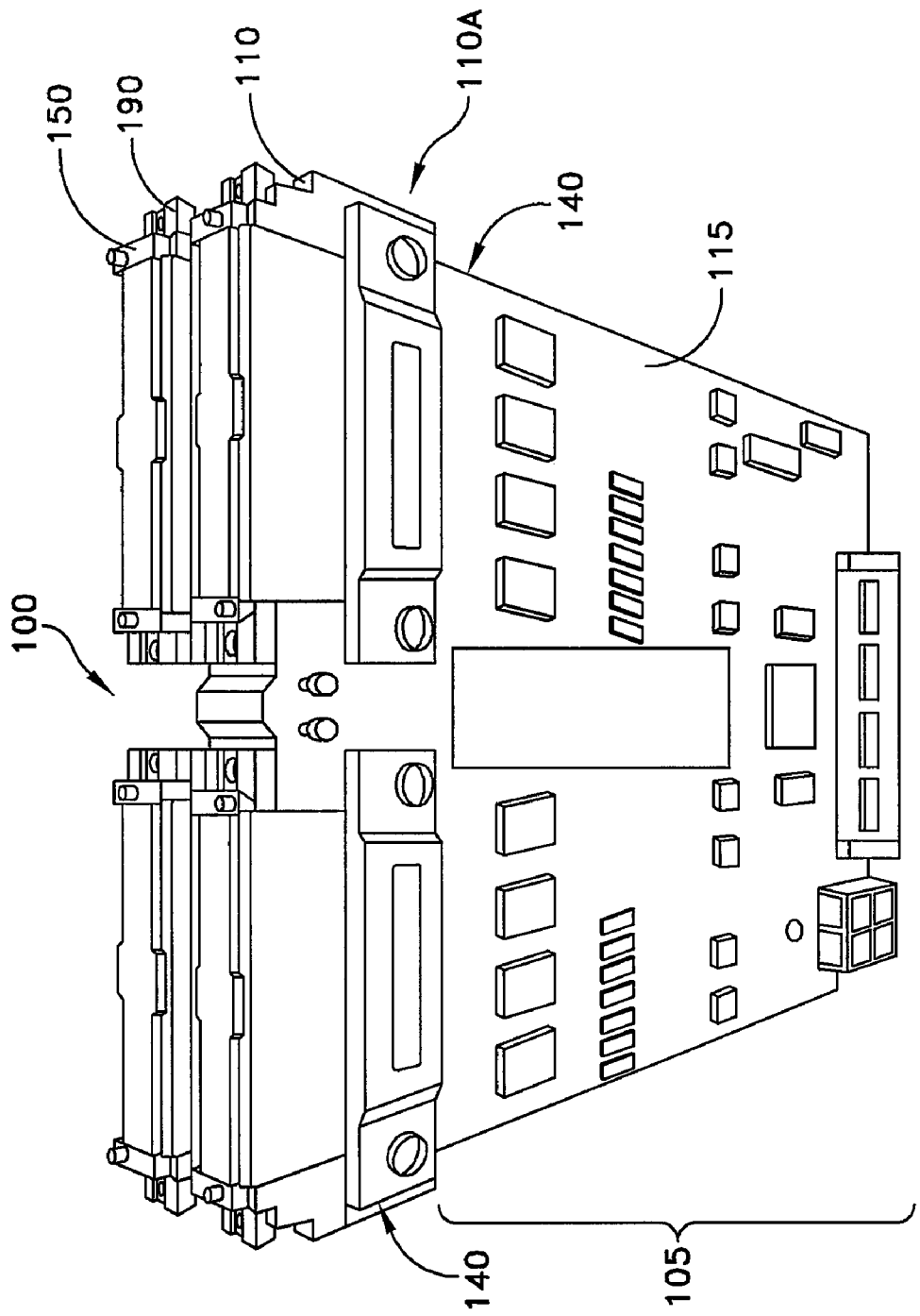
FIG. 3 illustrates an exemplary embodiment of a right-angle connection system with a pair with circuit boards of test system electronics.

Referring again to FIGS. 1, 2, 4A and 5, right angle connection may be made between interface demux board 105 (FIG. 4A) and the DUT socket card 500 (FIG. 5). The right angle connector 100 (FIG. 1) may include flexible circuit 110 (FIG. 1), support mechanism 180 (FIG. 1), and three interposers 140, 145, 150 (FIGS. 1 and 2). By routing the signals on both sides of demux board 105 (FIG. 4A), and then connecting them with flexible right angle loop circuit 110 (FIGS. 1,2, and 4A), limited space may be used to connect large numbers of signals.

Right angle connector may include flexible circuit 110 with transmission lines. Flexible circuit 110 may be formed in a U-shape. Two interposers 140,145 may be assembled inside on the ends to make contacts with pads on PCB 105. One interposer 150 may be assembled on the top of flexible circuit 110 to make contact with DUT socket card 500. Compliant support beam mechanism 180 may be configured under flexible circuit 110. In an embodiment, four of these assemblies 100 may be integrated with a pair of PCB 105 or demux boards 150 using a mechanical bolster block 185 (see FIG. 4A).

In an embodiment, flexible circuit 110 may include, for example, flexible polyimide or other printed dielectric material. Flexible polyimide material may be used to design 50 ohm traces in a multi-layer, signal-ground-signal stripline configuration. Copper layers may use a 0.5 oz thickness so as to provide a semi-rigid structure and meet electro-mechanical specifications. The trace width may be tightly controlled to within about 0.5 mils tolerance along with other parameters in the stack up so as to maintain an impedance variation within five-percent.

Spacing between signal traces may be optimized to keep near-end crosstalk (NEXT) and far-end crosstalk (FEXT) lower than two-percent, while maintaining a density of at least 340 signals/square-inch.

In one embodiment, flexible circuit 110 may be designed to have a high DC leakage resistance. For example, this resistance may be over 10 G Ohms so as to keep the leakage current to sub-nano amps.

In addition to 50 ohms signal traces, flexible circuit 110 may include power supply lines distributed across its width. The DC resistance of these traces may be configured in low milli-ohms. The power supply lines are designed to carry over 2 Amps of DC current. High temperature polyimide or other suitable adhesive may be used between layers to withstand temperatures up to +150 C.

In an embodiment, overall length of flexible circuit 110 may be kept under a few inches to provide a short interconnect between a custom ASIC on PCB 105, i.e., demux board 105, and the device socket card assembly 500. In one embodiment, flexible circuit is less than two inches. The electrical design of flexible circuit 110 may provide over 1 GHz 1 dB-BW, with minimal degradation to rise-time for high-speed digital signals.

In one embodiment, flexible circuit 110 is designed to be double-sided, i.e., to have signal pads on both its top and bottom sides. Pads 165 (or terminal areas of circuitry 165) in the middle of flexible circuit 110 are in opposite side 170, 175 of pads 170, 175 (or terminal areas of circuitry 170, 175) on distal ends. When formed in a U-shape, signal pads 170, 175 face inside towards sides 115, 120 of demux board 105 and pads 165 in the middle face out towards DUT socket board 500.

As best shown in FIG. 4A, flexible circuit 110 may include a strain-relief radius 190 so as to provide "wiggle" on both of its straight sides. This strain-relief may be added to allow for compliance of the connections being made and also for any material contraction or expansion with change in temperature. The degree of compliance is achieved through the implementation of strain-relief radius 190 in flexible circuit 110, which may be affixed to a saddle support 195 and by support beams under the saddle that may use pre-loaded springs, elastomer or similar compliant material 200. Insulator saddle support 195 generally provides mechanical support and a taut flatness to ensure reliable connectivity.

As illustrated in FIGS. 2 and 4A, registration pins 205 may be embedded in saddle 195 to provide alignment with interposers 150 and with device socket card assembly 500.

Interposers 140, 145, 150 are non-permanent, very short pieces of interconnect between flexible circuit 110 and one of the printed circuit boards. Interposers 140, 145 are assembled inside on the ends to make contact with pads 170, 175 on demux board 105. Interposer 150 is assembled on the top of flexible circuit 110 to make contact with DUT socket board 500. Inside interposers 140,145 may be is different from outside interposer 150 and may have about half as many contacts.

In an embodiment, both types of interposers 140, 145 and 150 may have arrays of contacts with fine pitch arrangement within the mm range. With wiping action, the contacts may provide a degree of compliance when mated to PC boards 105. Interposers 140, 145 may provide very low contact resistance while requiring low force per contact.

Registration holes 210 may be added in interposer 150 for alignment and polarity in order to make a more reliable connection.

Interposers 140, 145, 150 may be designed to be semi-permanent and may be include any number of interconnect technologies. In an embodiment, each of interposers 150 are designed into a pre-defined envelope 215 that allow for the substitution of a single interposer 150 upon failure. Furthermore, all interposers 150 may be substituted with other interposes 150 so as to provide another technology type or commercial source of supply.

Looking at FIG. 2, and in an embodiment, the ends of flexible circuit 110 may each be assembled with a metal bolster plate 220 with an insulator 225 in between. A compliant support beam with a spring mechanism may be assembled under saddle support 195 (FIG. 4A) of flexible circuit 110. Other implementations may include an elastomer or similar compliance mechanisms.

Bolster plate 220 may have short registration pins 230 and long registration pins 235 on opposite corners. Bolster plate 220 may be mounted on demux board 105 using fasteners 240. Registration pins 235 may go through insulator 225 and flex to demux board 105 for fine alignment.

Referring to FIG. 4B, and in an embodiment, two loops 110B may start and end on a common face of PCB 105.

For example, and especially for a specific application of assembly 100, flexible circuit 100 may be made more flexible by reducing the thickness of an outer layer of copper, changing the thickness of dielectric material, or adding slots, etc.

Most interfaces require right angle connection to an SCA. Assembly 100 with flexible circuit 110 offers a right-angle connection system between two perpendicular printed-circuit boards (i.e., tester electronics PCB 105 and the PCB of SCA 500) that is non-permanent, compliant, flexible, allow higher density of PCBs, preserves signal integrity, allows several in an array, and has a relatively low cost.

Assembly 100 may use non-permanent connections which does not require permanent connection to SCA 500 and rest of interface 520. This allows changing only SCA 500 or device specific interface 530 (DSI 530), which includes many SCAs, and reusing portions of the remaining interface 530 whenever different device types are tested. This allows customers to buy just the DSI 530, and not the entire interface 520, which may result in a lower overall cost.

Interposer 150 may be is a consumable and replaceable connector which mates with SCA 500. If the interposer becomes non-functional, it is replaceable in the field.

Numerous enhancements have been made in the interfaces to increase the DUT parallelism. This is typically done by sharing of existing resources either by passively splitting the transmission line or by use of active switching. In any case, a large number of the connections are required to SCA 500 while preserving signal integrity. Assembly 100 provides a high-performance, high density connector, which may be capable of over 340 signals/square-inch. With use of 128 connectors in an array, the pin density extension may be enabled to over 24000 impedance controlled transmission lines in an interface.

ATE test head 505 may have many pin-electronics sites requiring interface 520 to have many connectors in an array spread over a sizable area. These connectors may carry thousands of signals, which need to make reliable connection every time. Flexible circuit 110 of assembly 100 may provide compliance in three directions so as to allow for manufacturing tolerances.

In an interface using a custom ASIC based switch for switching, it is extremely important to locate the ASIC in close proximity to the DUT in order to minimize the signal degradation. Flexible circuit 110 provides a relatively short interconnect by employing straight traces.

A typical ATE test cell 515 generally includes test-head 505, manipulator 535, an interface 520, and a handler 525. All the pin-electronics sites and resources typically reside in test-head 505. Interface 520 may latch to test-head 505 and connects to all the pin electronics and utility signals with a combination of device specific and device non-specific sections. The interface portion 530 next to the test devices 510 is described here as device specific interface 530 (DSI 530). In a non-device specific interface, referred here as programmable matrix interface 600, these signals and power supplies are de-multiplexed using active test electronics on the pairs of demux printed circuit boards 105. The right-angle connector system 100 may be assembled on the each pair of demux boards 105 in interface 520. This array of connector assemblies 100 present top interconnect plane 125 to handler 525. Interface 520 is docked to handler 525 with DUTs 510 so as to test the devices 510 in parallel.

Referring to FIG. 7, and in an embodiment, a pair of right angle interconnects on each one of PCBs 105 may connect signals from sides 115, 120 to portions 705A and 705B of each one of right angle interconnects 700.

FIGS. 8A and 8B illustrate a right angle connection system 800A and a right angle connection system 800B, respectively. Right angle connection system 800A is a prior art system, and includes connectors 805A to both sides 115, 120 of PCB 105. A holder portion 810A, such as an epoxy block 810A, is used to retain connectors 805A. A connector 815A, such as a socket header connector 815A, is provided for connection with interposer assembly 150 and socket card 500.

Novel right angle connection system 800B (FIG. 8B) may include connectors 805B to both sides 115, 120 of PCB 105. A holder portion 810B, such as an epoxy block 810B, may be provided to retain connectors 805B. Flexible circuit 805B may wrap around a compliant support portion 815B and make connection to socket card 500 via interposer assembly 150 without requiring an additional connector portion, such as connector 815A (FIG. 8A).

In an embodiment, there may be provided methods of routing signals between at least one printed circuit board (PCB) within a test head and a socket card assembly for electrically connecting the at least one PCB with a plurality of devices under test. In an embodiment, a method may include electrically connecting first and second sides of the PCB and the socket card assembly with one another with at least one flexible circuit having a defined shape configured to interface with the socket card assembly along one plane and the sides of the PCB along other planes substantially perpendicular to the one plane.

In one embodiment, a method may optionally include connecting the at least one flexible circuit and the first and second sides of the at least one PCB together, respectively, with a pair of interposer assemblies. A method may include connecting the at least one flexible circuit and the socket card assembly together with an interposer assembly. In addition to connecting the flexible circuit and the PCB together, a method may include replacing one or both of the PCB and the flexible circuit. A method may further include removing the pair of interposer assemblies, replacing at least one of the PCB and the at least one flexible circuit, and reconnecting the pair of interposer assemblies.

In addition to connecting the flexible circuit and the socket card together, a method may include removing the interposer assembly, replacing the socket card assembly, and reconnecting the interposer assembly. A method may include removing the interposer assembly and the pair of interposer assemblies, replacing the at least one flexible circuit, and reconnecting the interposer assembly and the pair of interposer assemblies.

What is claimed is:

1. Apparatus for routing signals between at least one printed circuit board (PCB) within a test head and a socket card assembly for electrically connecting the at least one PCB with a plurality of devices under test, the apparatus comprising:

at least one flexible circuit for electrically connecting first and second sides of the PCB and the socket card assembly with one another, the at least one flexible circuit being electrically connected to the first and second sides of the PCB along first and second planes, and the at least one flexible circuit having a defined shape configured to provide an electrical interface for the socket card assembly, the electrical interface for the socket card assembly being intermediate locations where the at least one flexible circuit is electrically connected to the first and second sides of the PCB, and the electrical interface for the socket card assembly being provided in a third plane that is substantially perpendicular to the first and second planes;

wherein each of the at least one flexible circuit has a semi-rigid structure and a strain-relief radius, wherein the strain-relief radius provides a degree of compliance to the flexible circuit and the electrical interface.

2. Apparatus in accordance with claim 1, wherein the at least one flexible circuit includes a single flexible circuit configured for electrically connecting the socket card assembly with both of the first and second sides of the PCB.

3. Apparatus in accordance with claim 2, further comprising a pair of interposer assemblies for removable physical and electrical connection of the single flexible circuit to the first and second sides of the PCB, respectively.

4. Apparatus in accordance with claim 2, further comprising an interposer assembly for removable connection of the single flexible circuit and the socket card assembly to one another, the interposer assembly connected to the electrical interface for the socket card assembly on a first surface of the single flexible circuit, wherein the first surface of the single flexible circuit is opposite a second surface of the single flexible circuit, and wherein the second surface of the single flexible circuit faces the PCB.

5. Apparatus in accordance with claim 1, wherein the flexible circuit has a terminal area of circuitry, at the electrical interface for the socket card assembly, for removable connection with the socket card assembly on one side, and wherein the flexible circuit has a pair of terminal areas of circuitry for removable connection with the first and second sides of the PCB on another side opposite to the one side with the terminal area of circuitry for removable connection with the socket card assembly.

6. Apparatus in accordance with claim 1, wherein the flexible circuit has a terminal area of circuitry, at the electrical interface for the socket card assembly, for removable connection with the socket card assembly on one side, and wherein the flexible circuit has a terminal area of circuitry for removable connection with one of the first and second sides of the PCB on another side opposite to the one side with the terminal area of circuitry for removable connection with the socket card assembly.

7. Apparatus in accordance with claim 1, wherein the at least one flexible circuit includes a pair of flexible circuits configured for electrically connecting the socket card assembly with each of the first and second sides of the PCB, respectively.

8. Apparatus in accordance with claim 7, further comprising a pair of interposer assemblies for removable connection of the pair of flexible circuits to the first and second sides of the PCB, respectively.

9. Apparatus in accordance with claim 8, further comprising another pair of interposer assemblies for removable connection of the pair of flexible circuits to the socket card assembly, respectively.

10. Apparatus in accordance with claim 1, wherein the at least one flexible circuit comprises a multi-layer flexible circuit having traces formed therein in a signal-ground-signal stripline configuration.

11. Apparatus in accordance with claim 4, further comprising:
a saddle support positioned between the second surface of the single flexible circuit and the PCB, the saddle support having at least one registration pin embedded therein for providing alignment of the interposer assembly with respect to the flexible circuit.

12. A method of routing signals between at least one printed circuit board (PCB) within a test head and a socket card assembly for electrically connecting the at lease one PCB with a plurality of devices under test, the method comprising:
electrically connecting first and second sides of the PCB and the socket card assembly with one another using at least one flexible circuit, the at least one flexible circuit being electrically connected to the first and second sides of the PCB along first and second planes, and the at least one flexible circuit having a defined shape configured to provide an electrical interface for the socket card assembly, the electrical interface for the socket card assembly being intermediate locations where the at least one flexible circuit is electrically connected to the first and second sides of the PCB, and the electrical interface for the socket card assembly being provided in a third plane that is substantially perpendicular to the first and second planes, wherein the at least one flexible circuit is a multi-layer flexible circuit having traces formed therein in a signal-ground-signal stripline configuration;
positioning at least one interposer on the at least one flexible circuit; and
electrically connecting the at least one flexible circuit to the socket card assembly via the at least one interposer.

13. A method in accordance with claim 12, wherein electrically connecting first and second sides of the PCB and the socket card assembly with one another with at least one flexible circuit includes connecting the at lease one flexible circuit and the first and second sides of the at least one PCB together, respectively, with a pair of interposer assemblies.

14. A method in accordance with claim 13, further comprising removing the pair of interposer assemblies, replacing at least one of the PCB and the at least one flexible circuit, and reconnecting the pair of interposer assemblies.

15. A method in accordance with claim 13, wherein the electrically connecting first and second sides of the PCB and the socket card assembly with one another with at least one flexible circuit includes connecting the at least one flexible circuit and the socket card assembly together with an interposer assembly.

16. A method in accordance with claim 15, further comprising removing the interposer assembly, replacing the socket card assembly, and reconnecting the interposer assembly.

17. A method in accordance with claim 15, further comprising removing the interposer assembly and the pair of interposer assemblies, replacing the at least one flexible circuit, and reconnecting the interposer assembly and the pair of interposer assemblies.

18. An automated test equipment (ATE) system for testing a plurality of devices, the ATE system comprising:
a socket card assembly having a device specific interface for connection to a plurality of devices under test;
a test head having a i) a plurality of printed circuit boards (PCBs) for processing test signals, wherein each of the PCBs has first and second sides, and ii) a plurality of flexible circuits, wherein each of the flexible circuits,
is electrically connected to the first and second sides of a respective one of the PCBs along respective first and second planes; and
has a defined shape configured to provide an electrical interface to the socket card assembly, the electrical interface to the socket card assembly being located on the flexible circuit intermediate locations where the flexible circuit is electrically connected to the first and second sides of the PCB; and
a plurality of interposers, wherein each of the interposers provides a non-permanent, compliant connection between i) a respective one of the electrical interfaces to the socket card assembly, and ii) the socket card assembly.

19. An ATE system in accordance with claim 18, further comprising, for each of the flexible circuits, a pair of interposer assemblies for removable connection of the flexible circuit to the first and second sides of a respective one of the PCBs.

20. An ATE system in accordance with claim 18, wherein each of the flexible circuits is a multi-layer flexible circuit having traces formed therein in a signal-ground-signal stripline configuration.

21. An ATE system in accordance with claim 18, wherein each of the flexible circuits has a semi-rigid structure and a strain-relief radius, wherein the strain-relief radius provides a degree of compliance to the flexible circuit and its electrical interface.

22. An ATE system in accordance with claim 18, further comprising a plurality of saddle supports, wherein each of the saddle supports is i) positioned between one of the flexible circuits and the PCB to which the one of the flexible circuits is attached, and ii) has registration pins embedded therein for providing alignment of a respective one of the interposers with respect to the flexible circuit.

* * * * *